(12) United States Patent
Song et al.

(10) Patent No.: US 10,128,379 B2
(45) Date of Patent: Nov. 13, 2018

(54) SEMICONDUCTOR DEVICE HAVING CHANNEL REGIONS

(71) Applicant: SAMSUNG ELECTRONICS CO., LTD., Suwon-si (KR)

(72) Inventors: Seung Min Song, Hwaseong-si (KR); Woo Seok Park, Ansan-si (KR); Geum Jong Bae, Suwon-si (KR); Dong Il Bae, Seongnam-si (KR); Jung Gil Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/647,903

(22) Filed: Jul. 12, 2017

(65) Prior Publication Data

US 2018/0190829 A1    Jul. 5, 2018

(30) Foreign Application Priority Data

Jan. 4, 2017 (KR) .......................... 10-2017-0001330

(51) Int. Cl.
| | |
|---|---|
| *H01L 29/786* | (2006.01) |
| *H01L 29/06* | (2006.01) |
| *H01L 29/423* | (2006.01) |
| *H01L 29/66* | (2006.01) |
| *H01L 21/02* | (2006.01) |

(52) U.S. Cl.
CPC .. *H01L 29/78618* (2013.01); *H01L 21/02532* (2013.01); *H01L 21/02603* (2013.01); *H01L 29/0673* (2013.01); *H01L 29/42392* (2013.01); *H01L 29/66545* (2013.01); *H01L 29/66742* (2013.01); *H01L 29/78696* (2013.01)

(58) Field of Classification Search
CPC ......... H01L 29/78618; H01L 29/66545; H01L 21/02603; H01L 21/02532; H01L 29/78696; H01L 29/42392; H01L 29/0673; H01L 29/66742
See application file for complete search history.

(56) References Cited

U.S. PATENT DOCUMENTS

| | | | |
|---|---|---|---|
| 7,229,884 B2 | 6/2007 | Park | |
| 8,753,942 B2 | 6/2014 | Kuhn et al. | |
| 9,093,478 B1 | 7/2015 | Cheng et al. | |
| 9,224,849 B2* | 12/2015 | Colinge | .......... H01L 21/823431 |
| 9,257,527 B2 | 2/2016 | Hashemi et al. | |
| 9,318,553 B1 | 4/2016 | Cheng et al. | |
| 9,362,355 B1 | 6/2016 | Cheng et al. | |
| 9,425,291 B1 | 8/2016 | Balakrishnan et al. | |

(Continued)

OTHER PUBLICATIONS

World's first vertically stacked gate-allaround Si nanowire CMOS transistors, phys.org Dec. 23, 2016.*

*Primary Examiner* — Jarrett Stark
(74) *Attorney, Agent, or Firm* — Sughrue Mion, PLLC

(57) ABSTRACT

A semiconductor device includes a substrate; protruding portions extending in parallel to each other on the substrate; nanowires provided on the protruding portions and separated from each other; gate electrodes provided on the substrate and surrounding the nanowires; source/drain regions provided on the protruding portions and sides of each of the gate electrodes, the source/drain regions being in contact with the nanowires; and first voids provided between the source/drain regions and the protruding portions.

20 Claims, 23 Drawing Sheets

(56) References Cited

U.S. PATENT DOCUMENTS

| | | |
|---|---|---|
| 2006/0024874 A1 | 2/2006 | Yun et al. |
| 2009/0127584 A1* | 5/2009 | Morand ............ H01L 29/42392 257/192 |
| 2015/0318399 A1* | 11/2015 | Jeong ................. H01L 29/7853 257/401 |
| 2016/0071945 A1* | 3/2016 | Wang ................ H01L 29/42392 257/347 |
| 2016/0099338 A1* | 4/2016 | Chang ................ H01L 21/3065 257/347 |
| 2016/0268158 A1 | 9/2016 | Leobandung |
| 2017/0179248 A1* | 6/2017 | Pawlak ............. H01L 29/42392 |
| 2017/0194430 A1* | 7/2017 | Wood ................. H01L 29/0673 |
| 2017/0200738 A1* | 7/2017 | Kim ................... H01L 27/1203 |
| 2017/0309719 A1* | 10/2017 | Sun ................... H01L 29/42392 |

\* cited by examiner

SEMICONDUCTOR DEVICE HAVING CHANNEL REGIONS

CROSS-REFERENCE TO RELATED APPLICATION

This application claims priority from Korean Patent Application No. 10-2017-0001330, filed on Jan. 4, 2017 in the Korean Intellectual Property Office, the disclosure of which is incorporated herein by reference in its entirety.

BACKGROUND

1. Field

Example embodiments of present disclosure relate to a semiconductor device having a plurality of channel regions.

2. Description of Related Art

As one of the scaling techniques for increasing the density of a semiconductor device, a multi-gate transistor, in which a multi-channel active pattern (or a silicon body) having a fin or nanowire shape is formed on a substrate, and then a gate is formed on a surface of the multi-channel active pattern thereafter, has been proposed.

Since a three-dimensional channel is used in such a multi-gate transistor, it is advantageous to scale down a device. In addition, even when a gate length of the multi-gate transistor is not increased, current control capability may be improved. Moreover, a short channel effect (SCE) may be effectively suppressed.

SUMMARY

One or more example embodiments provide a semiconductor device with improved punch-through characteristics.

One or more example embodiments also provide a method of manufacturing a semiconductor device with improved punch-through characteristics.

According to an aspect of example embodiment, there is provided a semiconductor device including: a substrate; protruding portions extending in parallel to each other on the substrate; nanowires provided on the protruding portions and separated from each other; gate electrodes provided on the substrate and surrounding the nanowires; source/drain regions provided on the protruding portions and sides of each of the gate electrodes, the source/drain regions being in contact with the nanowires; and first voids provided between the source/drain regions and the protruding portions.

According to an aspect of another example embodiment, there is provided a semiconductor device including: a substrate; protruding portions extending in parallel to each other on the substrate; an isolation insulating layer provided on the substrate and covering a portion of side surfaces of the protruding portions; fin spacers provided on the isolation insulating layer and in contact with the side surfaces of the protruding portions; first channel regions provided on the protruding portions, the first channel regions being separated from each other and extended in a first direction; second channel regions provided above the first channel regions and extended in the first direction; gate electrodes extended in a second direction intersecting the first direction and surrounding the first channel regions and the second channel regions; inner spacers provided on sides of the gate electrodes, and between the first channel regions and the protruding portions; source/drain regions provided on the sides of the gate electrodes and connected to the first channel regions and the second channel regions; and first voids provided below the source/drain regions.

According to an aspect of another example embodiment, there is provided a semiconductor device including: a substrate; source/drain regions extended in a direction perpendicular to an upper surface of the substrate; nanowires providing a channel region extended in a first direction between the source/drain regions and separated from each other; a gate electrode surrounding the nanowires and extended in a second direction intersecting the first direction; a gate insulating film provided between the nanowires and the gate electrode; and voids between the source/drain regions and the substrate, wherein an upper boundary of the voids is lower than a lower surface of a lowermost nanowire among the nanowires.

According to an aspect of another example embodiment, there is provided a method of manufacturing a semiconductor device, the method including: stacking semiconductor layers on a substrate; removing portions of the semiconductor layers and the substrate to form fin structures, the fin structures including protruding portions of the substrate and remaining portions of the semiconductor layers stacked on the protruding portions; removing portions of the fin structures to form nanowires from the remaining portions of the semiconductor layers, the nanowires being separated from each other; forming source/drain regions between and in contact with the nanowires, wherein first voids are formed between the source/drain regions and the substrate; and forming gate electrodes surrounding the nanowires.

BRIEF DESCRIPTION OF DRAWINGS

The above and/or other aspects will be more clearly understood from the following detailed description of example embodiments, taken in conjunction with the accompanying drawings, in which.

DETAILED DESCRIPTION

Example embodiments will now be described in detail with reference to the accompanying drawings.

Figure 1:
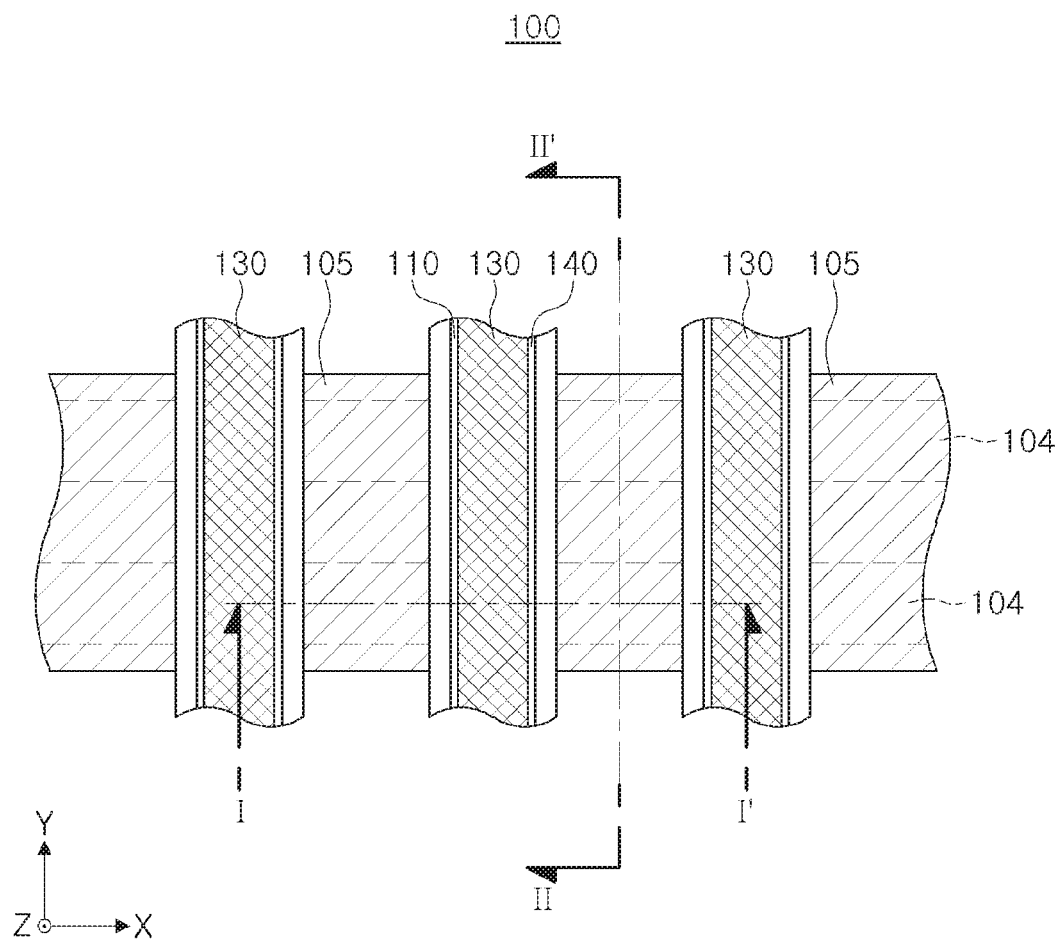
FIG. 1 is a plan view schematically illustrating a semiconductor device according to an example embodiment.

FIG. 1 is a plan view schematically illustrating a semiconductor device 100 according to an example embodiment.

With reference to FIG. 1, the semiconductor device 100 may include a plurality of protruding portions 104 on a substrate, and a plurality of gate electrodes 130 formed to intersect the plurality of protruding portions 104. The plurality of protruding portions 104, for example, may be extended in an X-axis direction. The plurality of gate electrodes 130, for example, may be extended in a Y-axis direction. A source/drain region 105 may be disposed on the plurality of protruding portions 104 on both sides of the plurality of gate electrodes 130. A plurality of channel regions passing through a gate electrode 130 may be formed to be connected to source/drain regions 105. In other words, the gate electrode 130 may be formed to intersect the plurality of protruding portions 104 while surrounding the plurality of channel regions. The plurality of channel regions may be provided by nanowires 120 disposed between the source/drain regions 105.

The gate electrode 130 may be formed of a material having conductivity, for example, a material such as metal, metal silicide, polysilicon, or the like. A gate insulating layer 110 and a first spacer 140 may be disposed on side surfaces of the gate electrode 130. The gate insulating layer 110 may be formed to intersect the plurality of protruding portions 104 while surrounding the channel regions in the same manner as the gate electrode 130.

Figure 2:
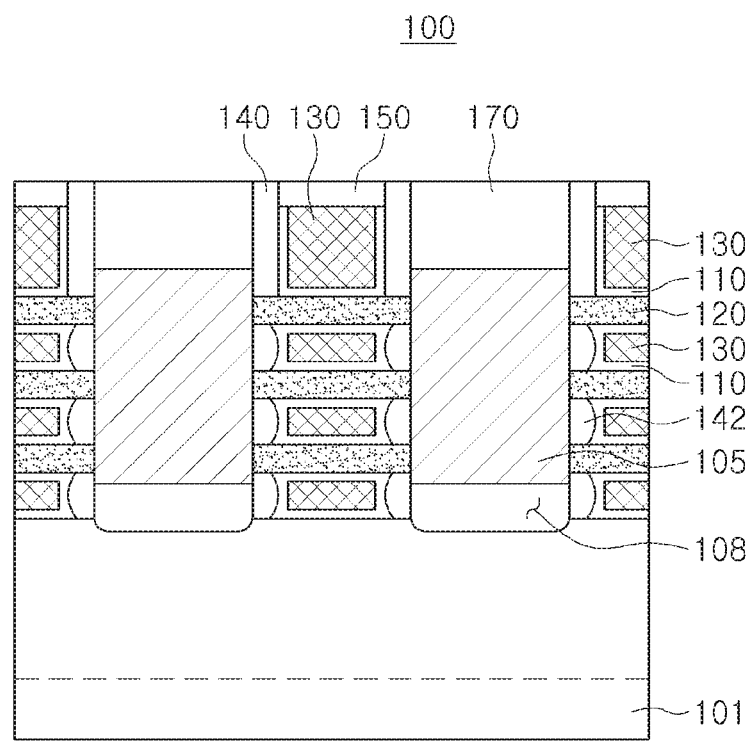
FIG. 2 is a cross-sectional view illustrating a cross section taken along line I-I' of the semiconductor device illustrated in FIG. 1.
Figure 3:
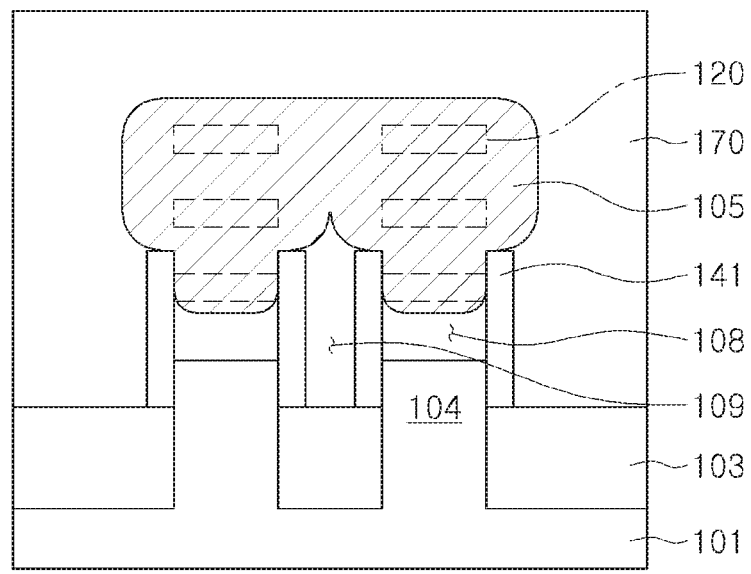
FIG. 3 is a cross-sectional view illustrating a cross section taken along line II-II' of the semiconductor device illustrated in FIG. 1.
Figure 3:
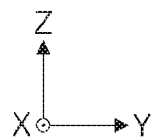

FIG. 2 is a cross-sectional view illustrating a cross section taken along line I-I' of the semiconductor device illustrated in FIG. 1. FIG. 3 is a cross-sectional view illustrating a cross section taken along line II-II' of the semiconductor device illustrated in FIG. 1.

With reference to FIGS. 2 and 3, a semiconductor device 100 according to an example embodiment may include a substrate 101, an isolation insulating layer 103, a source/drain region 105, a first void 108, a second void 109, a nanowire 120, a gate insulating layer 110, a gate electrode 130, a first spacer 140, a second spacer 141, a third spacer 142, and a protective layer 150.

Protruding portions 104 extended in a first direction (for example, an X-axis direction) parallel to each other may be formed on the substrate 101, and the isolation insulating layer 103 may be disposed on the substrate 101 to cover a portion of a side surface of the protruding portions 104 on the substrate 101. An upper surface of the isolation insulating layer 103 may be lower than an upper surface of the protruding portions 104 on the substrate 101. The protruding portions 104 may be a portion of the substrate 101. The protruding portions 104 may be referred to as active fins.

The source/drain regions 105 may be disposed above the protruding portions 104 in a direction perpendicular to an upper surface of the substrate 101. A plurality of nanowires 120 (or channel regions) extended in a first direction (for example, an X-axis direction) and separated from each other may be disposed between the source/drain regions 105. The plurality of nanowires 120 may be separated from each other at predetermined intervals above the substrate 101, and, in more detail, above each of the protruding portions 104. The gate electrode 130 may be extended in a second direction intersecting the first direction (for example, a Y-axis direction) while surrounding the plurality of nanowires 120 (or channel regions). For example, first channel regions may disposed on the substrate 101 to be separated from each other and extended in a first direction, and second channel regions may be disposed above the first channel regions to be extended in the first direction.

Respective first voids 108 may be disposed between respective source/drain regions 105 and the substrate 101. In more detail, the first voids 108 may be disposed between the protruding portions 104 on the substrate 101 and the source/drain regions 105, respectively. An upper boundary of each first void 108 may be defined by the source/drain region 105, and a lower boundary of each first void 108 may be defined by the substrate 101, and, in more detail, by the protruding portion 104. The first voids 108 may be filled with air. In this case, each of the first voids 108 may be referred to as an air gap or an air spacer. The first voids 108 may include a gas other than air.

A plurality of third spacers 142 may be disposed on both sides of the gate electrode 130, between the plurality of nanowires 120 (or channel regions), and between a lowermost nanowire 120 (or first channel region) and the substrate 101. One side surface of the third spacer 142 may have a convex shape toward the gate electrode 130. The third spacer 142 may be referred to as an inner spacer.

The third spacers 142 that are disposed on both sides of the gate electrode 130, and between the lowermost nanowire 120 and the substrate 101 (that is, lowermost third spacers or lowermost inner spacers 142) may define a side boundary of the first voids 108.

In a cross section, taken in a direction, in which the protruding portions 104 are extended, each of the first voids 108 may be sealed by the source/drain region 105, the protruding portion 104 of the substrate 101, and the lowermost third spacer (lowermost inner spacer) 142 of the plurality of third spacers 142.

The semiconductor device 100 may include second spacers 141 disposed on the isolation insulating layer 103 and disposed on both sides of the protruding portion 104. The second spacer 141 may be referred to as a fin spacer.

In a cross section taken in a direction in which the gate electrode 130 is extended, the first voids 108 may be sealed by the source/drain region 105, the second spacers 141, and the protruding portion 104.

At least a portion of a lower surface of the source/drain regions 105 may be located lower than a lower surface of a lowermost nanowire 120 among the plurality of nanowires 120. In addition, an upper surface of the source/drain region 105 may be formed higher than an upper surface of an uppermost nanowire 120 among the plurality of nanowires 120. Alternatively, an upper surface of the source/drain region 105 may be formed on the same level as an upper surface of the uppermost nanowire 120 among the plurality of nanowires 120.

Source/drain regions 105 formed on the protruding portions 104 of the substrate 101, adjacent to each other, may be combined with each other. The source/drain regions 105 may include portions having different widths. The source/drain regions 105 may include first portions disposed between the second spacers 141 and having a first width, and second portions disposed above the first portions and having a second width that is wider than the first width of the first portions. A lower surface of the first portions may be located lower than a lower surface of a lowermost nanowire 120 among the plurality of nanowires 120. The second portions of the source/drain regions 105 adjacent to each other may protrude outwardly of the second spacers 141, and may be connected to each other above the isolation insulating layer 103.

Figure 9:
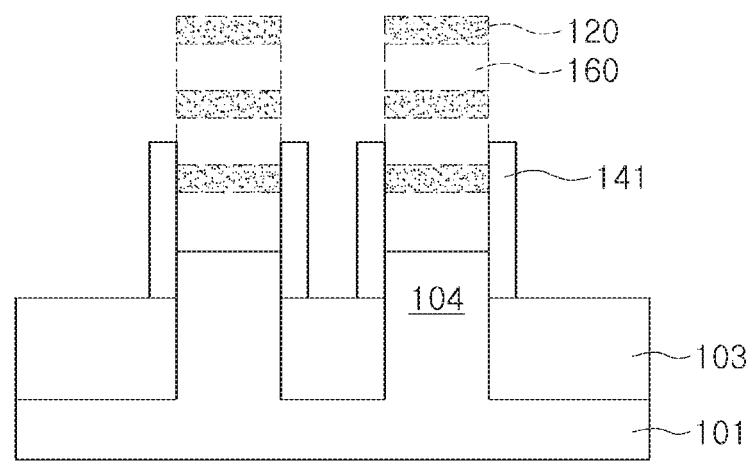

An upper end of the second spacers 141 may be higher than an upper surface of a lowermost nanowire 120 among the plurality of nanowires 120, and may be lower than a lower surface of a neighboring nanowire 120 adjacent to the lowermost nanowire 120, which may be more clearly understood with reference to FIG. 9. The upper end of the second spacers 141 may be higher than an upper surface of the protruding portions 104.

The semiconductor device 100 may further include second voids 109 between the isolation insulating layer 103 and the source/drain regions 105. In a cross section taken in a direction in which the gate electrodes 130 are extended, the second voids 109 may be sealed by the source/drain regions 105, the second spacers 141, and the isolation insulating layer 103.

When a distance between neighboring (adjacent) protruding portions 104 is narrow, the second spacers 141 located on the isolation insulating layer 103 between the neighboring protruding portions 104 may be combined with each other as a single second spacer. A second spacer 141, located on the isolation insulating layer 103 and between the neighboring protruding portions 104, may be thicker than a second spacer 141, located on the isolation insulating layer 103 outside the protruding portions 104. The isolation insulating layer 103 between the neighboring protruding portions 104 may be completely covered by the second spacer 141. In this case, the second void 109 may become smaller or may not be provided.

The gate electrode 130 may be disposed between the source/drain regions 105, and may be extended in one direction (for example, a Y-axis direction) above the substrate 101. The gate electrode 130 may be extended in one direction to be formed above the isolation insulating layer 103. The plurality of nanowires 120 may allow channel regions connected to the source/drain region 105 to be provided. When a voltage greater than a threshold voltage of the semiconductor device 100 is applied to the gate electrode 130, a depletion region is formed in at least a portion of the plurality of nanowires 120, and thus a current may flow between the source/drain regions 105. The number and arrangement of the plurality of nanowires 120 are not limited to those illustrated in FIG. 2, and may be variously modified.

First spacers 140 extended in the same direction as the gate electrode 130 may be disposed on both sides of the gate electrode 130. The first spacer 140 may be referred to as a gate spacer.

The plurality of nanowires 120 may be surrounded by the gate insulating layer 110 and upper and lower sides of the plurality of nanowires may be surround by the gate electrode 130. The nanowire 120 may have a shape of a sheet, in which a width in one direction is different from a width in the other direction. Alternatively, the nanowire 120 may have a cylindrical shape, an elliptical cylindrical shape, or a polygonal columnar shape. The gate insulating layer 110 may be disposed between the gate electrode 130 and the plurality of nanowires 120, and between the gate electrode 130 and the first spacer 140. In addition, the gate insulating layer 110 may be disposed between the gate electrode 130 and the isolation insulating layer 103. The gate insulating layer 110 may include a plurality of layers. For example embodiment, the gate insulating layer 110 may include a first insulating layer and a second insulating layer. The first insulating layer and the second insulating layer may have different permittivities, and a permittivity of the second insulating layer may be greater than a permittivity of the first insulating layer. In this case, the second insulating layer may be disposed closer to the gate electrode 130 than the first insulating layer. In other words, the first insulating layer may be disposed closer to the channel region than the second insulating layer. The second insulating layer, having a relatively higher permittivity, may have a thickness greater than that of the first insulating layer.

The second insulating layer, having a relatively higher permittivity, may include a high-k dielectric material. The high-k dielectric material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), and combinations thereof.

The gate electrode 130 may include a work function metal layer and a gate metal layer. A barrier metal layer may be further provided between the work function metal layer and the gate insulating layer 110. A threshold voltage of the semiconductor device 100 may be determined by a material included in the work function metal layer. In addition, the threshold voltage of the semiconductor device 100 may be determined by a material included in the gate insulating layer 110. The barrier metal layer may include a metal nitride such as titanium nitride (TiN), tantalum nitride (TaN), tantalum silicon nitride (TaSiN), titanium silicon nitride (TiSiN), or the like. The work function metal layer may include a first metal layer and a second metal layer stacked on each other, and the first metal layer and the second metal layer may include different materials. A material included in the work function metal layer may be different, depending on whether the semiconductor device 100 is an N-type transistor or a P-type transistor. When the semiconductor device 100 is an N-type transistor, the work function metal layer may include metal carbide containing hafnium, zirconium, titanium, tantalum, aluminum, or an alloy thereof. When the semiconductor device 100 is a P-type transistor, the work function metal layer may include ruthenium, palladium, platinum, cobalt, nickel, or an oxide thereof. However, a material forming the work function metal layer may be variously modified, in addition to the material described above. The gate metal layer may be formed of a metal material such as tungsten, or the like.

The protective layer 150 protecting the gate electrode 130 may be disposed above the gate electrode 130. Further, an interlayer insulating layer 170 may be disposed above the isolation insulating layer 103 to fill a gap between the gate electrodes 130 therewith, and may surround the source/drain region 105, or the like.

FIGS. 4 through 15 are cross-sectional views illustrating a method of manufacturing the semiconductor device illustrated in FIGS. 1, 2 and 3, according to an example embodiment.

FIGS. 4, 6, 8, 10, 11, 12, and 14 are views illustrating a cross section taken along line I-I' of FIG. 1, and FIGS. 5, 7, 9, 13, and 15 are views illustrating a cross section taken along line II-II' of FIG. 1.

Figure 4:
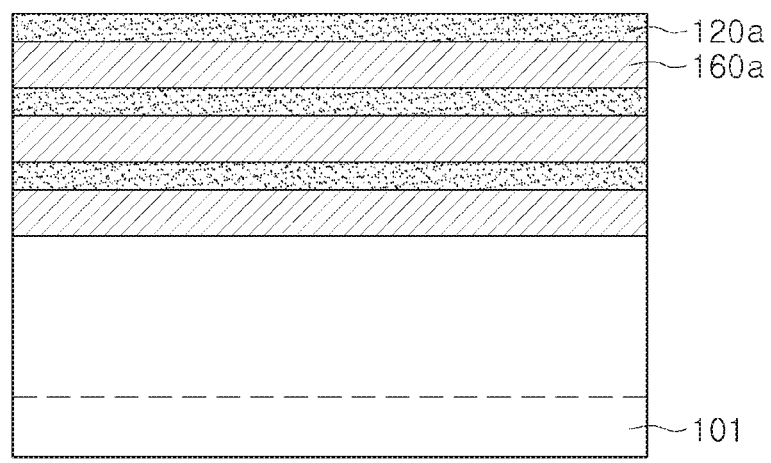
FIGS. 4 through 15 are cross-sectional views provided to illustrate a method of manufacturing the semiconductor device illustrated in FIGS. 2 and 3 according to an example embodiment.
Figure 5:
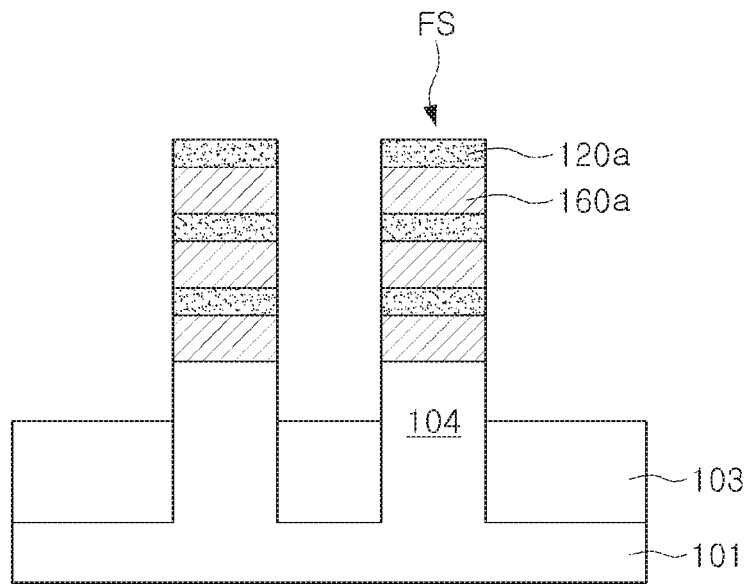
Figure 5:
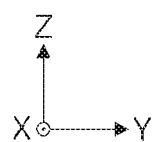

With reference to FIGS. 4 and 5, a plurality of semiconductor layers 120a and a plurality of sacrificial layers 160a may be alternately stacked on the substrate 101.

First, a sacrificial layer 160a is formed on the substrate 101, and a semiconductor layer 120a is formed on the sacrificial layer 160a. Another sacrificial layer 160a and another semiconductor layer 120a may be formed again. This process described is repeatedly performed several times, and thus a semiconductor layer 120a may be disposed uppermost. In FIGS. 4 and 5, three sacrificial layers 160a and three semiconductor layers 120a are alternately stacked, but the number of sacrificial layers 160a and the number of semiconductor layers 120a that are stacked may be variously modified. On the substrate 101, the plurality of semiconductor layers 120a may include a semiconductor material, and the plurality of sacrificial layers 160a may be formed of a material with etch selectivity to the plurality of semiconductor layers 120a. For example, the plurality of semiconductor layers 120a may include silicon (Si), and the plurality of sacrificial layers 160a may include silicon germanium (SiGe). Respective thicknesses of the plurality of semiconductor layers 120a and the plurality of sacrificial layers 160a may be variously modified according to an example embodiment. A thickness of each of the plurality of semiconductor layers 120a may be several nm to several tens of nm. A thickness of each of the plurality of sacrificial layers 160a may be greater than a thickness of each of the plurality of semiconductor layers 120a. The plurality of sacrificial layers 160a may be removed in a subsequent process, and the gate insulating layer 110 and the gate electrode 130 may be disposed in a space from which the plurality of sacrificial layers 160a have been removed.

The sacrificial layer 160a, disposed between neighboring semiconductor layers 120a, may include regions having different compositions. In other words, the sacrificial layer 160a may include an upper region in contact with the semiconductor layer 120a located above and a lower region in contact with the semiconductor layer 120a located below, in addition to a middle region having a different composition from those of the upper region and the lower region. In a case in which the plurality of semiconductor layers 120a are formed of silicon (Si) and the plurality of sacrificial layers 160a are formed of silicon germanium (SiGe), when the sacrificial layer 160a is side-etched in a subsequent process, an etch rate of the sacrificial layer 160a is low in a region in which the sacrificial layer 160a is in contact with the semiconductor layer 120a. In this regard, to complement such a low etch rate in the region described above, the upper region and the lower region may have a composition containing a high amount of germanium.

Next, a portion of the plurality of semiconductor layers 120a and the plurality of sacrificial layers 160a is removed, to form a fin structure FS.

As a mask pattern is formed on the substrate 101, on which the plurality of semiconductor layers 120a and the plurality of sacrificial layers 160a are stacked, and an anisotropic etching process is performed, the fin structure FS may be formed. The fin structure FS may include the plurality of semiconductor layers 120a and the plurality of sacrificial layers 160a, alternately stacked. In a process in which the fin structure FS is formed, a portion of the substrate 101 is removed, and thus the protruding portion 104 may be formed on an upper surface of the substrate 101. The protruding portion 104 of the substrate 101 may form the fin structure FS, along with the plurality of semiconductor layers 120a and the plurality of sacrificial layers 160a. In a region from which a portion of the substrate 101 has been removed, the isolation insulating layer 103 may be formed. The isolation insulating layer 103 may cover a portion of a side surface of the protruding portion 104 of the substrate 101. An upper surface of the isolation insulating layer 103 may be formed lower than an upper surface of the substrate 101. In more detail, the upper surface of the isolation insulating layer 103 may be formed lower than an upper surface of the protruding portion 104 on the substrate 101. In other words, the protruding portion 104 on the substrate 101 may protrude above the isolation insulating layer 103.

The fin structure FS may be extended in a specific direction, for example, in an X-axis direction, on the substrate 101. A plurality of fin structures FS spaced apart from each other may be formed on the substrate 101. A width of the fin structures FS in a Y-axis direction and a distance between the fin structures FS in the Y-axis direction may be several nm to several tens of nm. In FIG. 5, two fin structures FS are illustrated, but the number of fin structures FS is not limited thereto.

After the fin structure FS and the isolation insulating layer 103 are formed, the mask pattern may be removed.

Figure 6:
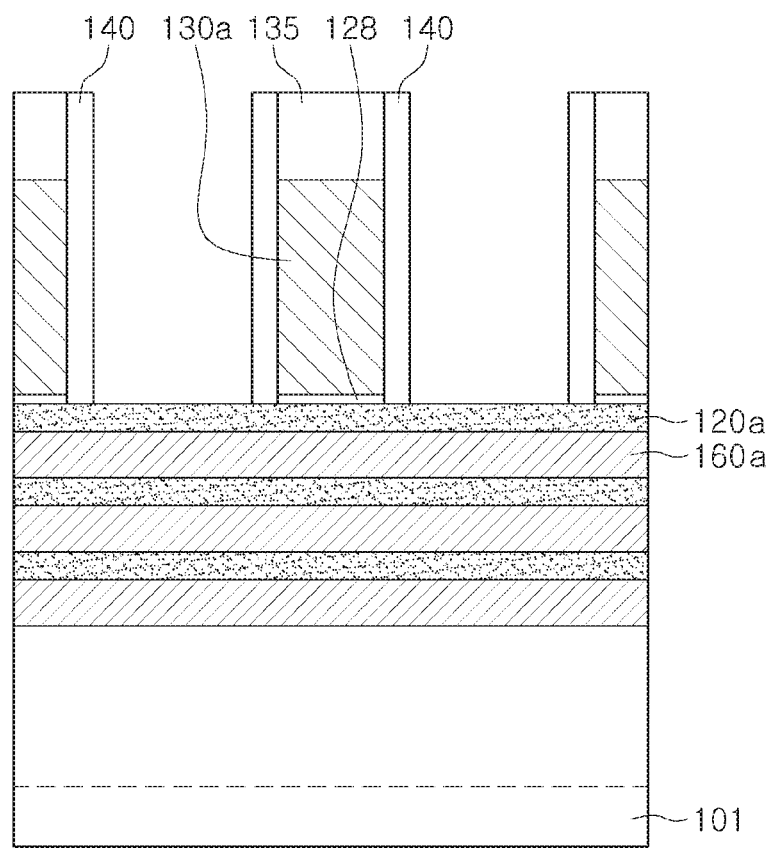
Figure 7:
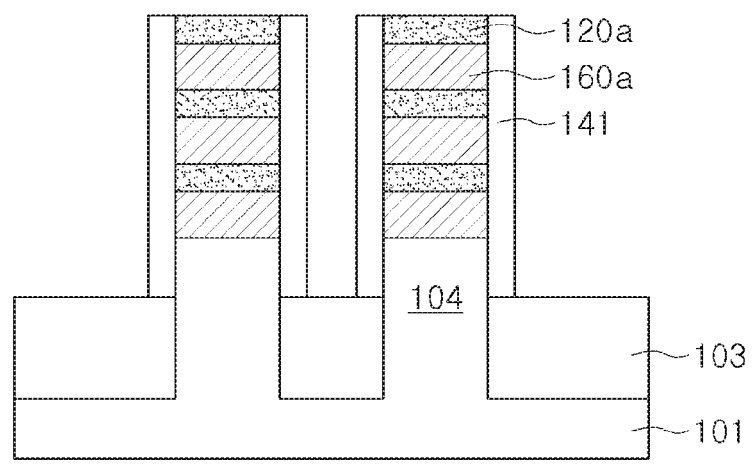
Figure 7:
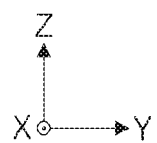

With reference to FIGS. 6 and 7, a dummy gate 130a and a first spacer 140 on both side walls of the dummy gate 130a may be formed on the fin structure FS. In addition, a second spacer 141 may be formed on both side walls of the fin structure FS. A dummy insulating layer 128 may be disposed between the dummy gate 130a and an uppermost semiconductor layer 120a.

After the dummy insulating layer 128 is formed, a material layer forming the dummy gate 130a may be formed. Thereafter, as the material layer is anisotropically etched using a mask pattern 135, the dummy gate 130a may be formed. Next, after a spacer material layer is formed, covering the dummy gate 130a and the fin structure FS, an anisotropic etching process is performed. Thus, the first spacer 140 is formed on a side wall of the dummy gate 130a, and the second spacer 141 is formed on a side wall of the fin structure FS. The first spacer 140 may cover at least a portion of both side walls of the mask pattern 135.

The dummy gate 130a and the first spacer 140 may be extended in a specific direction, for example, in a Y-axis direction, while intersecting the fin structure FS. The dummy gate 130a and the first spacer 140 may be disposed to cover the fin structure FS and the isolation insulating layer 103. The second spacer 141 may be formed to intersect the first spacer 140. The second spacer 141 may be disposed on the isolation insulating layer 103. An upper end of the second spacer 141 may be formed at substantially the same level as an upper surface of the fin structure FS.

The dummy gate 130a may be formed of polysilicon, and the first spacer 140 and the second spacer 141 may be formed of silicon oxide, silicon oxynitride, silicon nitride, silicon oxycarbide (SiOC), silicon oxycarbonitride (SiOCN), silicon borocarbonitride (SiBCN), or combinations thereof. The dummy insulating layer 128 may include silicon oxide.

The dummy gate 130a may be substituted with the gate electrode 130 (referring to FIG. 2) in a subsequent gate replacement process. Thus, a gate length of the gate electrode 130 may be substantially the same as a width of the dummy gate 130a in a direction (an X-axis direction).

Figure 8:
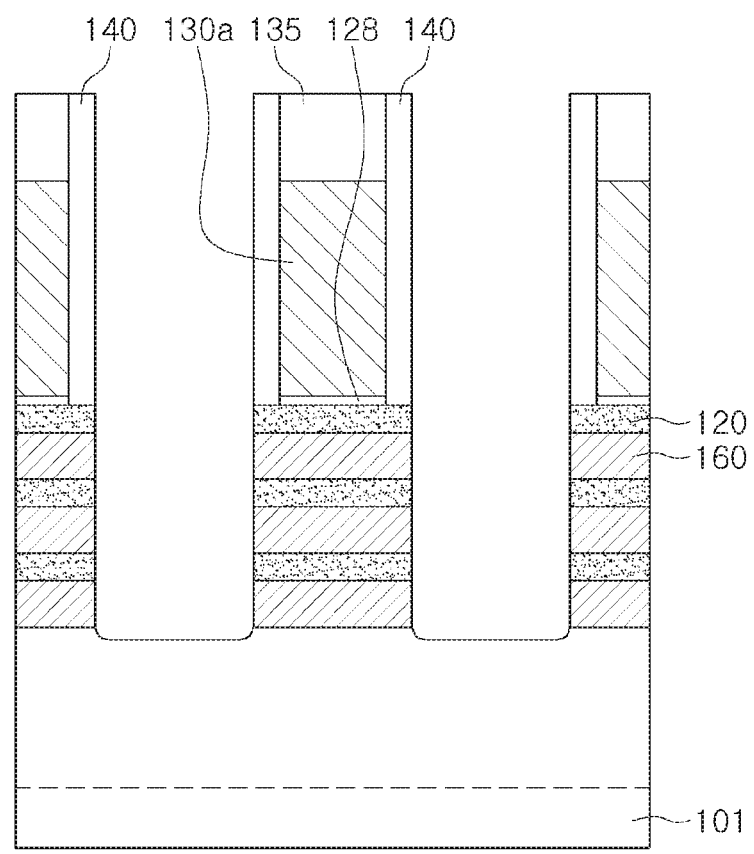

Next, with reference to FIGS. 8 and 9, as an anisotropic etching process, in which the dummy gate 130a and the first spacer 140 are used as an etch mask, is performed, the plurality of nanowires 120 may be formed.

In the anisotropic etching process, a portion of the fin structure FS is removed outside the dummy gate 130a and the first spacer 140, and the plurality of nanowires 120 may be formed below the dummy gate 130a and the first spacer 140. In addition, a plurality of sacrificial patterns 160 may be formed between the plurality of nanowires 120.

An upper surface of the substrate 101, in a region from which the fin structure FS has been removed, may be exposed, and a portion of the upper surface of the substrate 101 may be removed. In greater detail, a portion of the protruding portion 104 of the substrate 101, in a region from which the fin structure FS has been removed, may be exposed, and a portion of an upper surface of the protruding portion 104 of the substrate 101 may be removed.

A surface, having been exposed, of the plurality of nanowires 120, in a region from which the fin structure FS has been removed, may be used for formation of the source/drain region 105, using a subsequent selective epitaxial growth (SEG) process.

With reference to FIG. 9, an upper end of the second spacer 141 may be higher than an upper surface of a lowermost nanowire 120 among the plurality of nanowires 120. In addition, the upper end of the second spacer 141 may be lower than a lower surface of a neighboring nanowire 120 adjacent to the lowermost nanowire 120. Conditions of an etching process for removing the fin structure FS are adjusted to properly adjust a height of the upper end of the second spacer 141 to a desired height.

Figure 10:
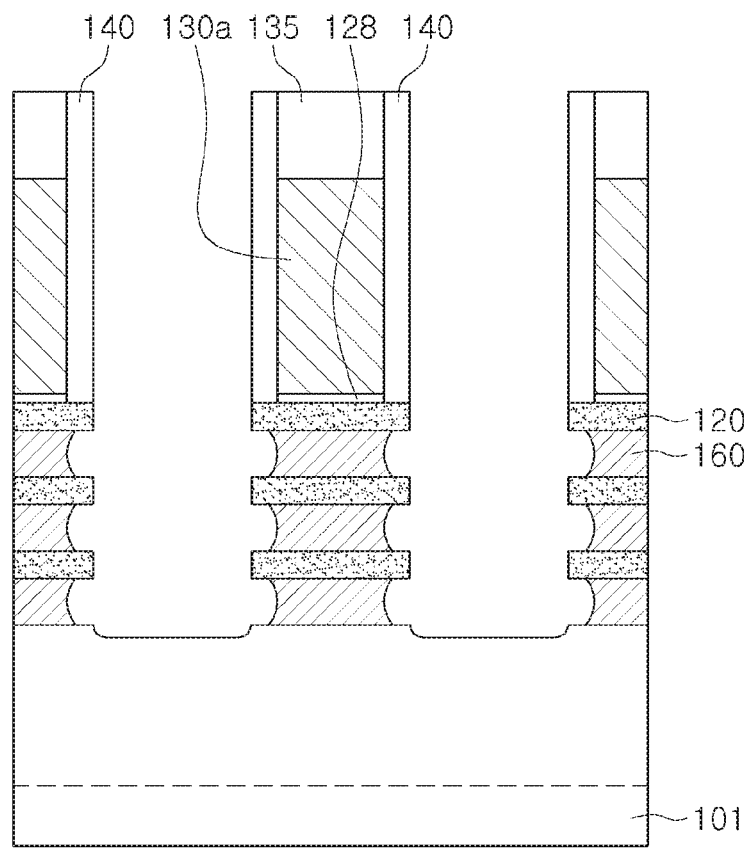

With reference to FIG. 10, a portion of the plurality of sacrificial patterns 160, having been exposed, in a region from which the fin structure FS has been removed, is removed to form side spaces.

As illustrated in FIG. 10, to form the side spaces, a portion of the plurality of sacrificial patterns 160 may be side-etched. Side etching may be performed, for example, by a wet etching process. As previously described, a sacrificial pattern 160 may be formed of a material with a predetermined etch selectivity with respect to a material forming the nanowire 120. In an example embodiment, the nanowire 120 may be formed of silicon (Si), and the sacrificial pattern 160 may be formed of silicon germanium (SiGe). In the wet etching process, an etchant with a high selective etch rate of silicon germanium with respect to silicon may be used. For example, an etchant containing hydrogen peroxide ($H_2O_2$), hydrofluoric acid (HF), and acetic acid ($CH_3COOH$), an etchant containing ammonium hydroxide ($NH_4OH$), hydrogen peroxide ($H_2O_2$), and deionized water ($H_2O$), an etchant containing peracetic acid, or combinations thereof may be used.

Due to the side-etching, a side surface of the plurality of sacrificial patterns 160 may have a concave shape. A depth of the concave shape may be formed to be 2 nm or less, and for example, 1 nm or less.

Figure 11:
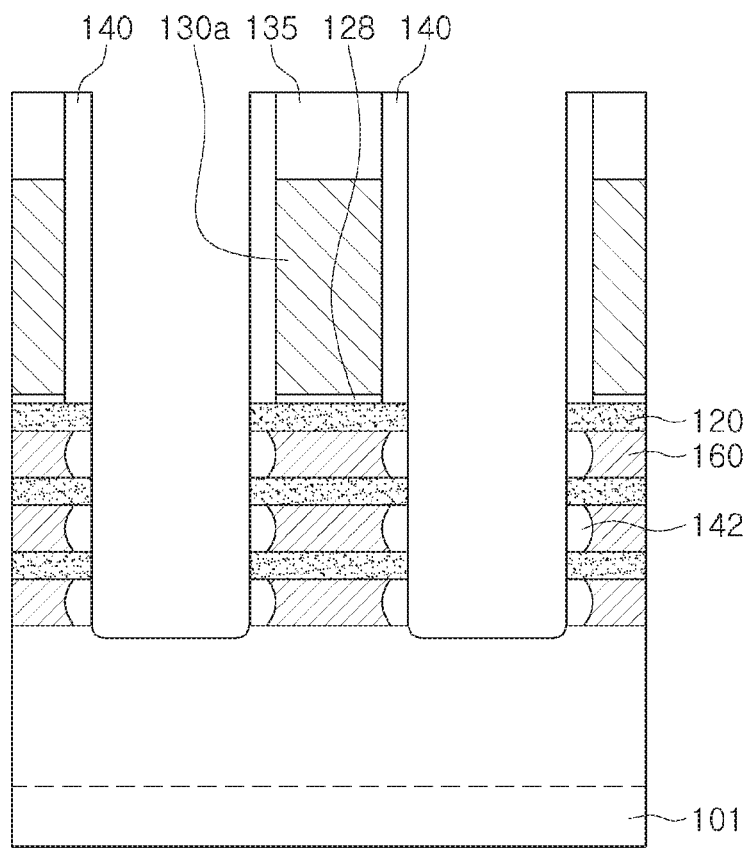

Next, with reference to FIG. 11, a side space may be filled with an insulating material to form the third spacer 142.

After an insulating material is deposited on the substrate 101 to fill the side space therewith, the insulating material deposited on a region other than the side space is removed in an etching process, and thus the third spacer 142 may be formed.

The third spacer 142 may be formed of the same material as the first spacer 140, but embodiments are not limited thereto. In an example embodiment, the first spacer 140 and the third spacer 142 may be formed of silicon oxide, silicon oxynitride, silicon nitride, SiOC, SiOCN, SiBCN, or combinations thereof.

Figure 12:
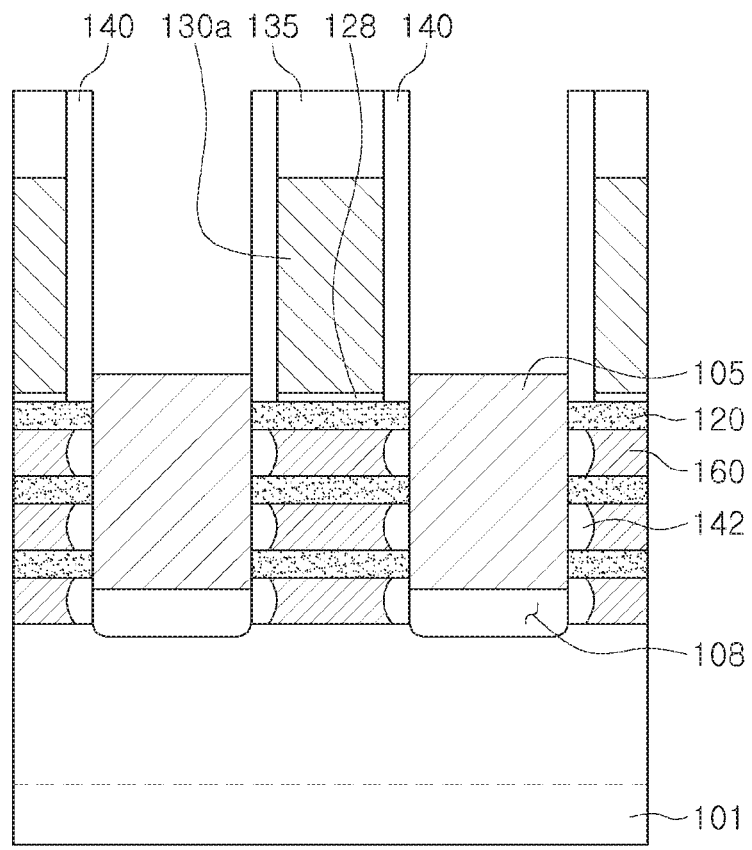
Figure 13:
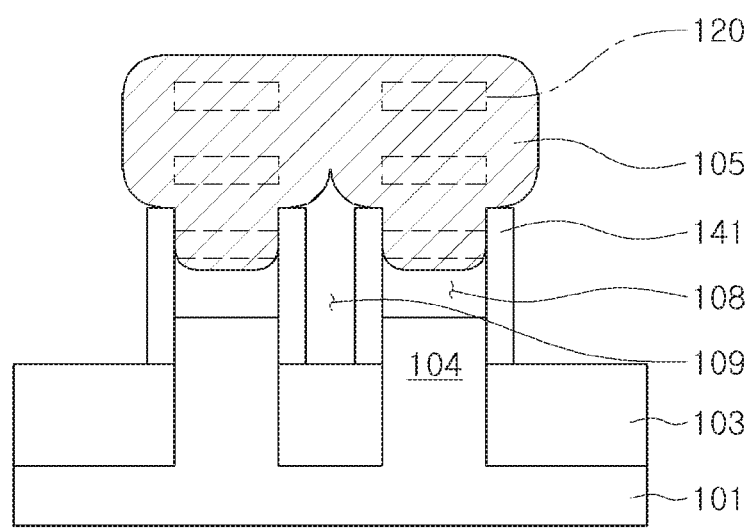
Figure 13:
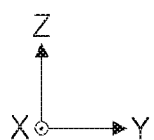

With reference to FIGS. 12 and 13, selective epitaxial growth (SEG) is used to form the source/drain region 105 from a surface of the nanowire 120. A first void 108 may be formed below the source/drain region 105. The first void 108 may be formed between the source/drain region 105 and the substrate 101.

The first void 108 may be referred to as an air gap or an air spacer.

A lower surface of the source/drain regions 105 may be located lower than a lower surface of a lowermost nanowire 120 among the plurality of nanowires 120. In addition, an upper surface of the source/drain region 105 may be formed higher than an uppermost nanowire 120 among the plurality of nanowires 120. Alternatively, the upper surface of the source/drain region 105 may be formed on the same level as the upper surface of the uppermost nanowire 120 among the plurality of nanowires 120.

With reference to FIG. 13, in a cross section taken in a direction in which the dummy gate 130a is extended, the first void 108 may be sealed by the source/drain region 105, the second spacers 141, and the protruding portion 104.

The source/drain regions 105 may include portions having different widths. The source/drain regions 105 may include a first portion disposed between the second spacers 141 and having a first width, and a second portion disposed on the first portion and having a second width that is wider than the first width of the first portion.

The source/drain regions 105, formed above the protruding portions 104 of the substrate 101, which are adjacent to each other, may be combined with each other. The second portions of the source/drain regions 105 may be connected to each other. That is, the second void 109 may be formed between the source/drain regions 105 and the isolation insulating layer 103. In a cross section, taken in a direction in which the dummy gate 130a is extended, the second void 109 may be sealed by the source/drain region 105, the second spacers 141, and the isolation insulating layer 103.

Figure 14:
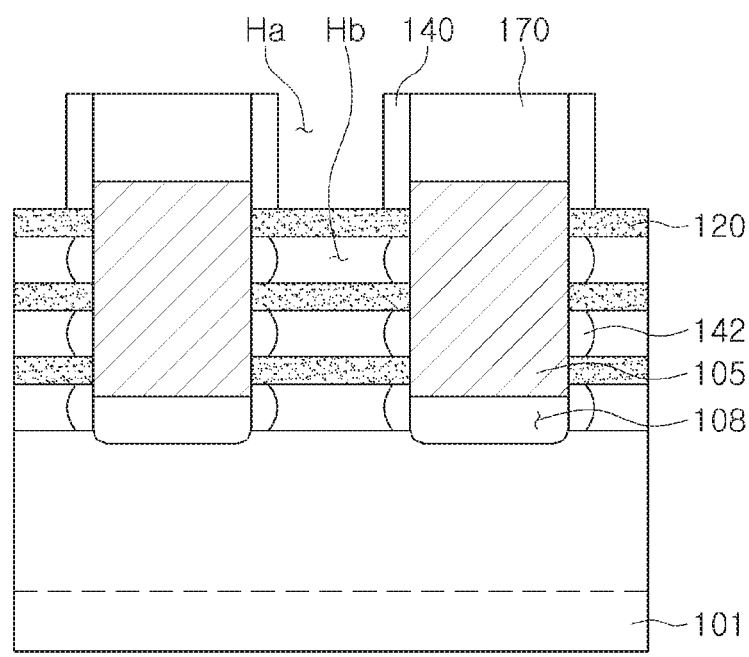
Figure 15:
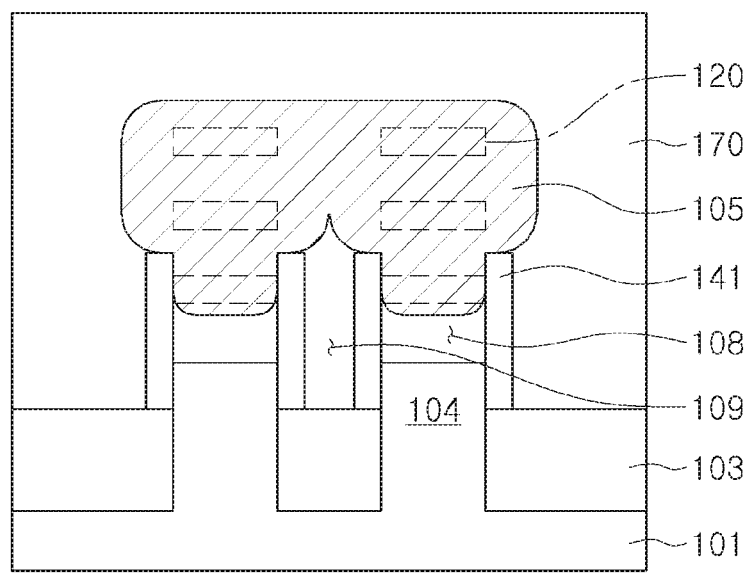
Figure 15:
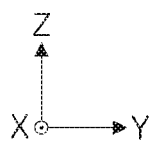

With reference to FIGS. 14 and 15, the interlayer insulating layer 170 may be formed. The interlayer insulating layer 170 may cover the first spacer 140, the second spacer 141, and the source/drain region 105.

Next, the dummy gate 130a, the dummy insulating layer 128, and the sacrificial patterns 160 may be removed.

Etch selectivity among the dummy gate 130a, the first spacer 140, and the source/drain region 105 is used, and only the dummy gate 130a is selectively removed to form an opening Ha. In a process in which the opening Ha is formed, the dummy insulating layer 128 may be removed simultaneously. As the dummy gate 130a is removed, the plurality of nanowires 120 and the sacrificial pattern 160 may be exposed externally in a space between the first spacers 140 through the opening Ha.

In addition, the sacrificial pattern 160 may be selectively removed to form an opening Hb. To selectively remove the sacrificial pattern 160, an etchant having an etch rate of silicon germanium, higher than that of silicon, may be used. For example, an etchant containing hydrogen peroxide ($H_2O_2$), hydrofluoric acid (HF), and acetic acid ($CH_3COOH$), an etchant containing ammonium hydroxide ($NH_4OH$), hydrogen peroxide ($H_2O_2$), and deionized water ($H_2O$), an etchant containing peracetic acid, or combinations thereof may be used.

Again, with reference to FIGS. 2 and 3, the gate insulating layer 110 and the gate electrode 130 may be formed.

The gate insulating layer 110 may be disposed in the opening Ha between the first spacers 140 and the opening Hb between the nanowires 120. In an example embodiment, the gate insulating layer 110 may be disposed to surround the nanowire 120 in a Y-axis direction and a Z-axis direction. The gate insulating layer 110 may include a first insulating layer and a second insulating layer having different permittivity. The second insulating layer may be a high-k dielectric material, with higher permittivity than that of the first insulating layer. The first insulating layer may be disposed to be closer to the first spacer 140 and the nanowire 120 than the second insulating layer. The gate insulating layer 110 may be formed using a process such as atomic layer deposition (ALD), chemical vapor deposition (CVD), or the like, and the second insulating layer may be formed to be thicker than the first insulating layer. In an example embodiment, a thickness of the first insulating layer may be about 1 nm or less, and a thickness of the second insulating layer may be about 1 nm to 2 nm.

A barrier metal layer, a work function metal layer, and a gate metal layer are formed in sequence on the gate insulating layer 110 to form the gate electrode 130. The protective layer 150 may be further provided on the gate electrode 130.

The protective layer 150 may be formed of a silicon nitride film, or the like. The protective layer 150 may be formed to prevent a threshold voltage from being changed by penetration of oxygen, or the like, into the gate electrode 130. To form the protective layer 150, a portion of the gate electrode 130 is removed, and the protective layer 150 may be provided within a region from which the portion of the gate electrode 130 has been removed.

Figure 16:
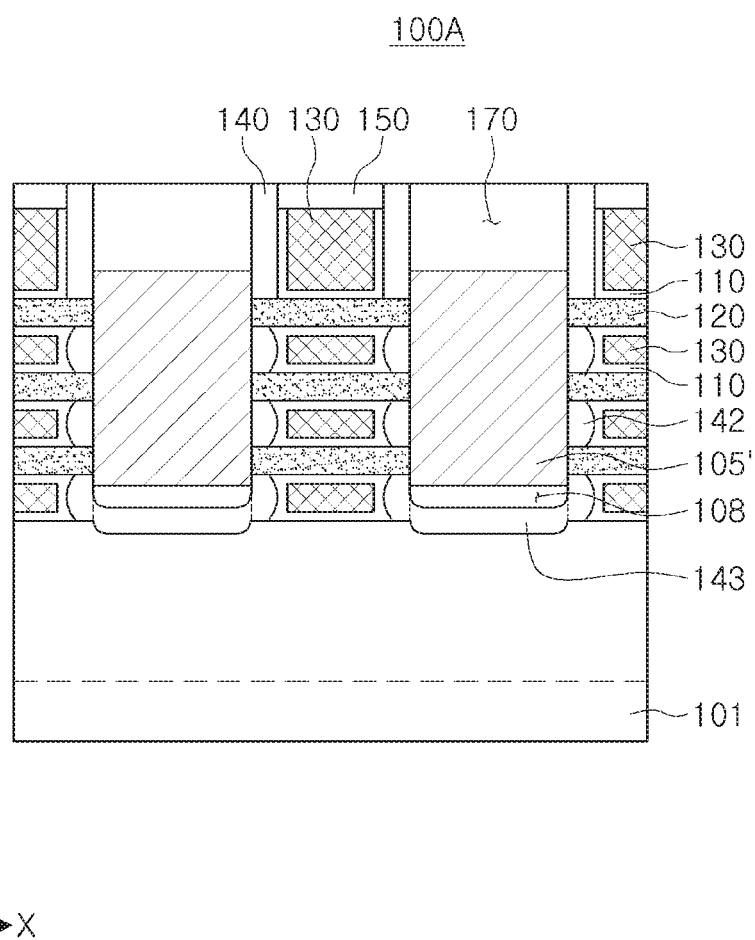
FIGS. 16 and 17 are cross-sectional views illustrating a semiconductor device according to an example embodiment.
Figure 17:
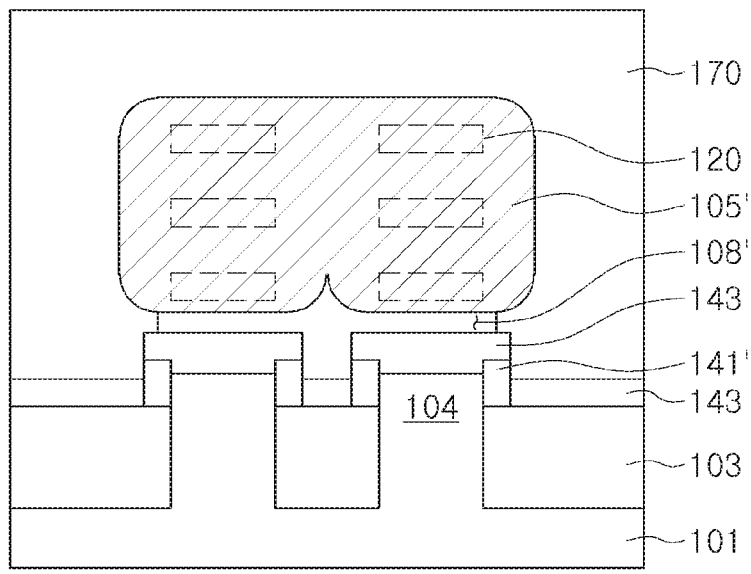
Figure 17:
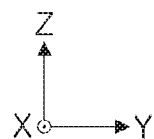

FIGS. 16 and 17 are cross-sectional views illustrating a semiconductor device 100A according to an example embodiment. FIG. 16 is a cross-sectional view illustrating a cross section taken in line I-I' of FIG. 1. FIG. 17 is a cross-sectional view illustrating a cross section taken in line II-II' of FIG. 1.

The semiconductor device 100A, illustrated in FIGS. 16 and 17, has a source/drain region 105' and a structure below the source/drain region, different from the semiconductor device 100 illustrated in FIGS. 2 and 3, but the remainder of its structure is similar to the semiconductor device 100.

With reference to FIGS. 16 and 17, the semiconductor device 100A, according to an example embodiment, may include a substrate 101, an isolation insulating layer 103, a source/drain region 105', a void 108', a nanowire 120, a gate insulating layer 110, a gate electrode 130, a first spacer 140, a second spacer 141', a third spacer 142, an insulating layer 143, and a protective layer 150.

The isolation insulating layer 103 may be disposed on the substrate 101 to cover a side surface of the protruding portion 104 on the substrate 101. An upper surface of the isolation insulating layer 103 may be lower than an upper surface of the protruding portion 104 of the substrate 101. The semiconductor device 100A may include second spacers 141', disposed on the isolation insulating layer 103 and disposed on both sides of the protruding portion 104. An upper end of the second spacers 141' may be lower than a lower surface of a lowermost nanowire 120. The upper end of the second spacers 141' may be higher than an upper surface of the protruding portion 104.

Source/drain regions 105' may be disposed on the protruding portion 104 of the substrate 101 in a direction perpendicular to an upper surface of the substrate 101. The void 108' may be disposed between the source/drain regions 105' and the substrate 101. The insulating layer 143 may be disposed between the substrate 101 and the void 108'. In detail, the insulating layer 143 may be disposed between the protruding portion 104 of the substrate 101 and the void 108'. The insulating layer 143 may be disposed to cover the protruding portion 104 and the second spacers 141'. The insulating layer 143 may be disposed on the isolation insulating layer 103. The insulating layer 143 may be formed of the same material as the third spacer 142.

An upper boundary of the void 108' may be defined by the source/drain region 105, and a lower boundary of the void 108' may be defined by the insulating layer 143. In a cross section taken in a direction in which the protruding portion 104 is extended, the void 108' may be sealed by the source/drain region 105, the insulating layer 143, and the second spacers 141'.

The void 108' may be filled with air. In this case, the void 108' may be referred to as an air gap or an air spacer. However, the void 108' may include a gas other than air.

A lower surface of the source/drain regions 105' may be located lower than a lower surface of a lowermost nanowire 120 among the plurality of nanowires 120. In addition, an upper surface of the source/drain region 105' may be formed to be higher than an upper surface of an uppermost nanowire 120 among the plurality of nanowires 120. Alternatively, the upper surface of the source/drain region 105' may be formed on the same level as the upper surface of the uppermost nanowire 120 among the plurality of nanowires 120.

The semiconductor device 100A may further include an interlayer insulating layer 170, disposed on the isolation insulating layer 103 and the source/drain regions 105'.

The source/drain regions 105' formed on the protruding portions 104 of the substrate 101, which are adjacent to each other, may be combined with each other.

In a cross section taken in a direction in which the gate electrode 130 is extended, the void 108' may be sealed by the source/drain region 105', the insulating layer 143, the second spacer 141', and the interlayer insulating layer 170. The void 108' may be integrally disposed on neighboring protruding portions 104.

When a distance between the neighboring protruding portions 104 is narrow, the second spacers 141' located on the isolation insulating layer 103 between the neighboring protruding portions 104 may be combined with each other. A second spacer 141' located on an isolation insulating layer 103 between neighboring protruding portions 104 may be thicker than a second spacer 141' located on an isolation insulating layer 103 outside protruding portions 104. The isolation insulating layer 103 between the neighboring protruding portions 104 may be completely covered by the second spacer 141'. In this case, the second spacer 141' and the insulating layer 143 may be stacked on the isolation insulating layer 103 between the neighboring protruding portions 104. In this case, in a cross section taken in a direction, in which the gate electrode 130 is extended, the void 108' may be sealed by the source/drain region 105', the insulating layer 143, and the interlayer insulating layer 170. The void 108' may be integrally disposed on the neighboring protruding portions 104.

Figure 18:
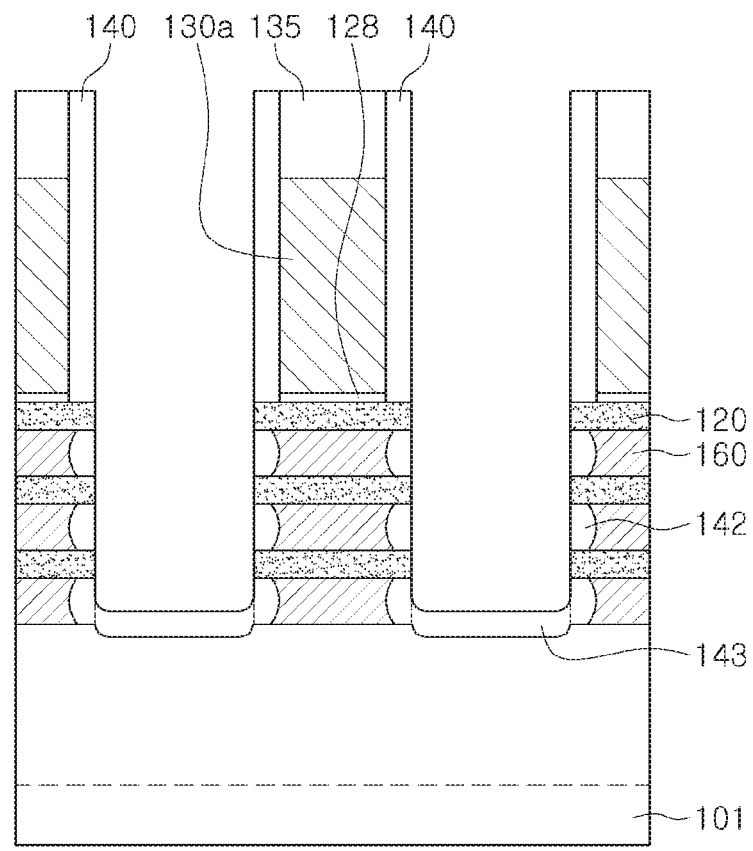
FIGS. 18 and 19 are cross-sectional views provided to illustrate a method of manufacturing the semiconductor device illustrated in FIGS. 16 and 17.
Figure 19:
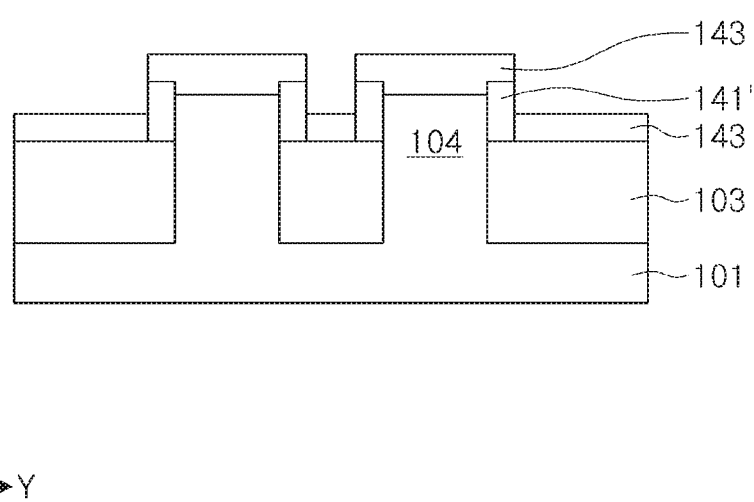
Figure 19:
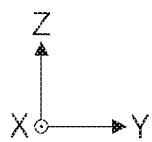

FIGS. 18 and 19 are cross-sectional views provided to illustrate a method of manufacturing the semiconductor device 100A illustrated in FIGS. 16 and 17.

After processes illustrated with reference to FIGS. 3 through 7 are performed, when a process of FIG. 8 is performed, conditions of an etching process of removing the fin structure FS are adjusted to allow a level of an upper end of the second spacer 141' to be lower than a level of a lower surface of a lowermost nanowire 120. Thereafter, processes illustrated with reference to FIGS. 9 and 10 may be performed. In addition, in a process in which the third spacer 142 of FIG. 11 is formed, when an insulating material is deposited on the substrate 101 to fill the side space, the insulating material may be non-conformally deposited thereon. In other words, the insulating material may be more thickly deposited on an upper surface of the substrate 101 than on a side surface of the nanowire 120. Next, when an etching process is performed to allow the insulating material to remain on the side space, the third spacer 142, inside the side space, and the insulating layer 143, remaining on an upper surface of the substrate 101, may be formed.

After processes illustrated with reference to FIGS. 12 through 15 are performed, when the gate insulating layer 110 and the gate electrode 130 are formed, the semiconductor device 100A may be manufactured.

Figure 20:
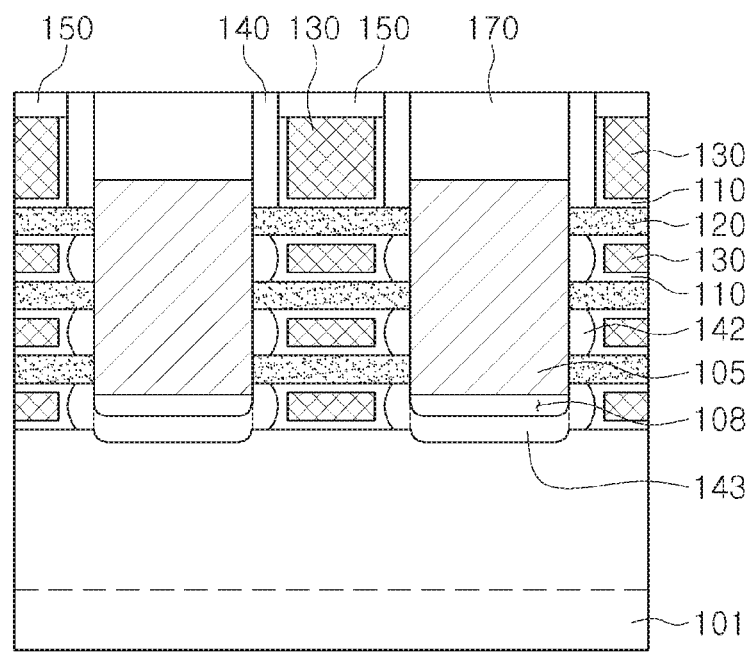
FIGS. 20 and 21 are cross-sectional views illustrating a semiconductor device according to an example embodiment.
Figure 21:
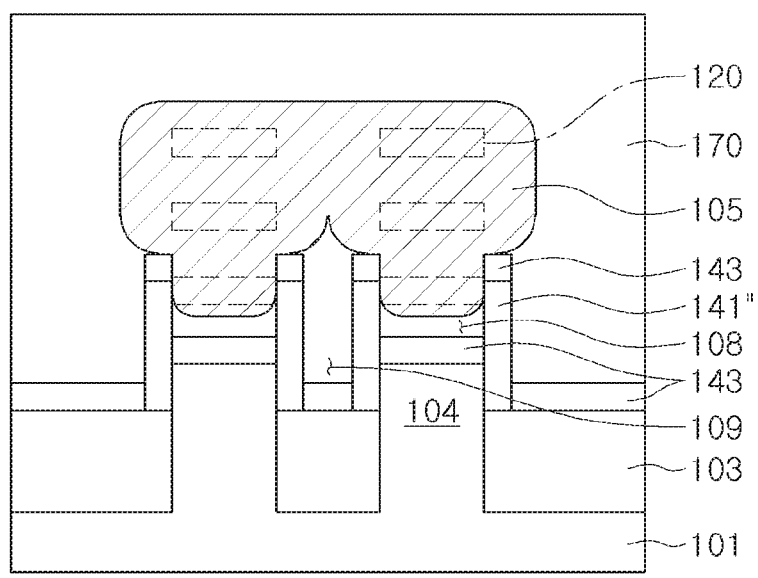

FIGS. 20 and 21 are cross-sectional views illustrating a semiconductor device according to an example embodiment. FIG. 20 is a cross-sectional view illustrating a cross section taken in line I-I' of FIG. 1. FIG. 21 is a cross-sectional view illustrating a cross section taken in line II-II' of FIG. 1.

A semiconductor device 100B, illustrated in FIGS. 20 and 21, may be understood as a structure in which the semiconductor device 100, illustrated in FIGS. 2 and 3, is combined with the semiconductor device 100A, illustrated in FIGS. 16 and 17.

With reference to FIGS. 20 and 21, the semiconductor device 100B according to an example embodiment may include a substrate 101, an isolation insulating layer 103, a source/drain region 105, a nanowire 120, a gate insulating layer 110, a gate electrode 130, a first spacer 140, a second spacer 141", a third spacer 142, an insulating layer 143, and a protective layer 150.

The isolation insulating layer 103 may be disposed on the substrate 101 to cover a side surface of the protruding portions 104 on the substrate 101. An upper surface of the isolation insulating layer 103 may be lower than an upper surface of the protruding portions 104 on the substrate 101. The semiconductor device 100B may include second spacers 141" disposed on the isolation insulating layer 103 and disposed on both sides of respective protruding portions 104. The insulating layer 143 may be disposed on the protruding portions 104 and the second spacers 141". The insulating layer 143 may be formed of the same material as the third spacer 142. An upper end of the insulating layer 143 disposed on the second spacers 141" may be higher than an upper surface of a lowermost nanowire 120, and may be lower than a lower surface of a neighboring nanowire 120 adjacent to the lowermost nanowire 120.

The source/drain regions 105 may be disposed above the protruding portion 104 in a direction perpendicular to an upper surface of the substrate 101. The first void 108 may be disposed between the source/drain regions 105 and the substrate 101. The insulating layer 143 may be disposed between the substrate 101 and the first void 108. In detail, the insulating layer 143 may be disposed between the protruding portion 104, on the substrate 101, and the first void 108.

An upper boundary of the first void 108 may be defined by the source/drain region 105, and a lower boundary of the first void 108 may be defined by the insulating layer 143.

In a cross section taken in a direction, in which the gate electrode 130 is extended, the first void 108 may be sealed by the source/drain region 105, the insulating layer 143, and the second spacer 141".

The source/drain regions 105 formed on the protruding portions 104 of the substrate 101, which are adjacent to each other, may be combined with each other.

The semiconductor device 100B may further include the second voids 109 between the isolation insulating layer 103 and the source/drain regions 105. In a cross section taken in a direction in which the gate electrodes 130 are extended, the second voids 109 may be sealed by the source/drain region 105, the second spacers 141", and the insulating layer 143.

When a distance between neighboring protruding portions 104 is narrow, second spacers 141", located on the isolation insulating layer 103 between the neighboring protruding portions 104, may be combined with each other. A second spacer 141" located on the isolation insulating layer 103 between the neighboring protruding portions 104 may be thicker than a second spacer 141" located on the isolation insulating layer 103 outside the protruding portions 104. An isolation insulating layer 103 between the neighboring protruding portions 104 may be completely covered by the second spacer 141". In this case, the second spacer 141" and the insulating layer 143 may be stacked on the isolation insulating layer 103 between the neighboring protruding portions 104. In this case, the second void 109 may become smaller or may not be formed.

Figure 22:
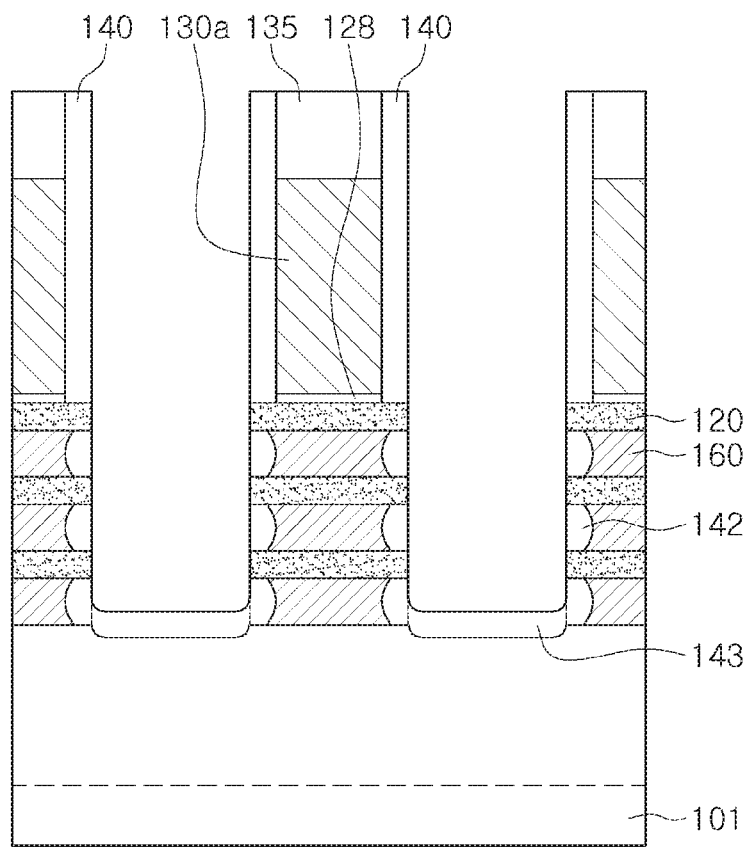
FIGS. 22 and 23 are cross-sectional views provided to illustrate a method of manufacturing the semiconductor device illustrated in FIGS. 20 and 21.
Figure 23:
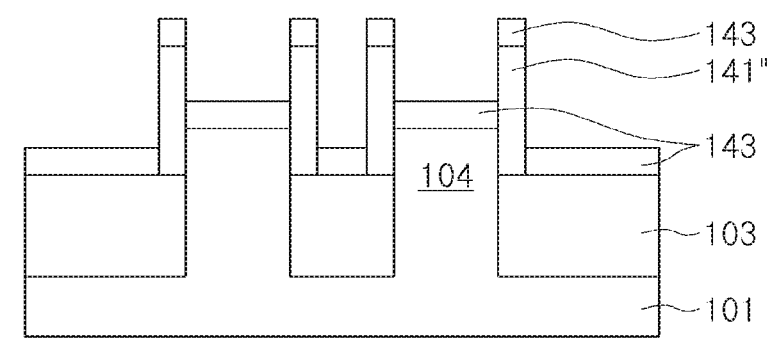
Figure 23:
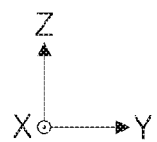

FIGS. 22 and 23 are cross-sectional views provided to illustrate a method of manufacturing the semiconductor device illustrated in FIGS. 20 and 21.

After processes illustrated with reference to FIGS. 3 through 10 are performed, in a process in which the third spacer 142 of FIG. 11 is formed, when an insulating material is deposited on the substrate 101 to fill the side space therewith, the insulating material may be non-conformally deposited thereon. In other words, the insulating material is more thickly deposited on an upper surface of the substrate 101 than on a side surface of the nanowire 120. Next, when an etching process is performed to allow the insulating material to remain on the side space, the third spacer 142 may be formed in the side space, and the insulating layer 143, remaining on an upper surface of the substrate 101, may be formed. The insulating layer 143 may remain on the second spacer 141".

After remaining processes illustrated with reference to FIGS. 12 through 15 are performed, when the gate insulating layer 110 and the gate electrode 130 are formed, the semiconductor device 100B may be manufactured.

As set forth above, according to the example embodiments, a void is disposed below source/drain regions, and thus punch-through characteristics of a semiconductor device may be improved.

In addition, a process of manufacturing a semiconductor device may be simplified and process costs may be reduced.

While example embodiments have been shown and described above, it will be apparent to those skilled in the art that modifications and variations could be made without departing from the scope of the present disclosure, as defined by the appended claims.

What is claimed is:
1. A semiconductor device comprising:
a substrate;
protruding portions extending in parallel to each other on the substrate;
nanowires provided on the protruding portions and separated from each other;
gate electrodes provided on the substrate and surrounding the nanowires;
source/drain regions provided on the protruding portions and sides of each of the gate electrodes, the source/drain regions being in contact with the nanowires; and
first voids provided between the source/drain regions and the protruding portions.

2. The semiconductor device of claim 1, further comprising inner spacers provided on the sides of the gate electrodes, and between the nanowires, and between a lowermost nanowire among the nanowires and the substrate.

3. The semiconductor device of claim 2, wherein, in a cross section taken in a first direction in which the protruding portions are extended, the first voids are sealed by the source/drain regions, the protruding portions, and lowermost inner spacers of the inner spacers.

4. The semiconductor device of claim 2, wherein one side surface of each of the inner spacers has a convex shape toward the gate electrodes.

5. The semiconductor device of claim 2, further comprising an insulating layer provided between the protruding portions and the first voids.

6. The semiconductor device of claim 5, wherein the insulating layer is in contact with a lowermost inner spacer of the inner spacers.

7. The semiconductor device of claim 1, wherein a lower surface of each of the source/drain regions is lower than a lowermost nanowire of the nanowires.

8. The semiconductor device of claim 1, further comprising:
an isolation insulating layer provided on the substrate and covering a portion of a side surface of each of the protruding portions; and
fin spacers provided on the isolation insulating layer and in contact with side surfaces of the protruding portions.

9. The semiconductor device of claim 8, wherein an upper end of each of the fin spacers is higher than an upper surface of a lowermost nanowire among the nanowires, and is lower than a lower surface of a neighboring nanowire adjacent to the lowermost nanowire.

10. The semiconductor device of claim 8, wherein an upper end of each of the fin spacers is higher than an upper surface of each of the protruding portions.

11. The semiconductor device of claim 8, wherein, in a cross section taken in a direction in which the gate electrodes are extended, each of the first voids is sealed by each of the source/drain regions, the fin spacers, and the protruding portions.

12. The semiconductor device of claim 8, wherein each of the source/drain regions includes a first portion provided between the fin spacers and having a first width, and a second portion provided on the first portion and having a second width that is wider than the first width of the second portion.

13. The semiconductor device of claim 1, further comprising an insulating layer provided between the protruding portions and the first voids.

14. A semiconductor device comprising:
a substrate;
protruding portions extending in parallel to each other on the substrate;
an isolation insulating layer provided on the substrate and covering a portion of side surfaces of the protruding portions;
fin spacers provided on the isolation insulating layer and in contact with the side surfaces of the protruding portions;
first channel regions provided on the protruding portions, the first channel regions being separated from each other and extended in a first direction;
second channel regions provided above the first channel regions and extended in the first direction;
gate electrodes extended in a second direction intersecting the first direction and surrounding the first channel regions and the second channel regions;
inner spacers provided on sides of the gate electrodes, and between the first channel regions and the protruding portions;
source/drain regions provided on the protruding portions and the sides of the gate electrodes, the source/drain regions being connected to the first channel regions and the second channel regions; and
first voids provided between the source/drain regions and the protruding portions.

15. The semiconductor device of claim 14, further comprising an insulating layer provided between the first voids and the substrate,
wherein the insulating layer is in contact with the inner spacers, and covers the protruding portions and the fin spacers.

16. The semiconductor device of claim 15, wherein, in a cross section taken in a direction in which the protruding portions are extended, the first voids are sealed by the source/drain regions, the insulating layer, and the inner spacers.

17. The semiconductor device of claim 14, further comprising an interlayer insulating layer covering the isolation insulating layer and the source/drain regions.

18. The semiconductor device of claim 17, further comprising an insulating layer provided between the first voids and the substrate,
wherein, in a cross section taken in a direction in which the gate electrodes are extended, the first voids are sealed by the source/drain regions, the insulating layer, the fin spacers, and the interlayer insulating layer.

19. The semiconductor device of claim 18, wherein the first voids are integrally provided on neighboring protruding portions of the protruding portions.

20. A semiconductor device comprising:
a substrate;
protruding portions extending in parallel to each other on the substrate;
source/drain regions provided on the protruding portions and extended in a direction perpendicular to an upper surface of the substrate;
nanowires providing a channel region extended in a first direction between the source/drain regions and separated from each other;
a gate electrode surrounding the nanowires and extended in a second direction intersecting the first direction;
a gate insulating film provided between the nanowires and the gate electrode; and
voids provided between the source/drain regions and the protruding portions,
wherein an upper boundary of the voids is lower than a lower surface of a lowermost nanowire among the nanowires.

* * * * *